(12) United States Patent
Berger et al.

(10) Patent No.: US 11,328,896 B2
(45) Date of Patent: May 10, 2022

(54) DEVICE AND METHOD FOR TRACKING MICROSCOPIC SAMPLES

(71) Applicant: Carl Zeiss Microscopy GmbH, Jena (DE)

(72) Inventors: Wolfgang Berger, Gerstetten (DE); Simon Diemer, Lauchheim (DE)

(73) Assignee: Carl Zeiss Microscopy GmbH, Jena (DE)

( * ) Notice: Subject to any disclaimer, the term of this patent is extended or adjusted under 35 U.S.C. 154(b) by 244 days.

(21) Appl. No.: 16/398,817

(22) Filed: Apr. 30, 2019

(65) Prior Publication Data

US 2019/0341223 A1 Nov. 7, 2019

(30) Foreign Application Priority Data

May 4, 2018 (DE) .......................... 10 2018 206 898

(51) Int. Cl.
| | | |
|---|---|---|
| *G02B 21/34* | (2006.01) | |
| *H01J 37/20* | (2006.01) | |
| *G06K 7/10* | (2006.01) | |
| *H01J 37/26* | (2006.01) | |

(52) U.S. Cl.
CPC .......... *H01J 37/20* (2013.01); *G06K 7/10366* (2013.01); *H01J 37/26* (2013.01)

(58) Field of Classification Search
CPC .......... H01J 37/20; H01J 37/26; H01J 37/261; H01J 2237/28; H01J 2237/201; G06K 7/10366; G02B 21/34
See application file for complete search history.

(56) References Cited

U.S. PATENT DOCUMENTS

| | | | |
|---|---|---|---|
| 6,445,451 B1 * | 9/2002 | Douglas-Hamilton ... | G01J 3/50 356/319 |
| 8,283,176 B2 * | 10/2012 | Bland .............. | G01N 35/00732 436/63 |
| 2014/0061502 A1 * | 3/2014 | Torrisi ................ | H01J 37/3056 250/442.11 |
| 2015/0311034 A1 | 10/2015 | Agorio | |
| 2017/0207062 A1 * | 7/2017 | Dufresne ................ | H01J 37/26 |
| 2019/0287759 A1 * | 9/2019 | Own ..................... | H01J 37/244 |

FOREIGN PATENT DOCUMENTS

| | | | | |
|---|---|---|---|---|
| WO | WO 89/01698 A1 | 2/1989 | | |
| WO | WO-8901698 A1 * | 2/1989 | ....... | G01N 35/00732 |

OTHER PUBLICATIONS

German Office Action, with translation thereof, for corresponding DE Appl No. 10 2018 206 898.4, dated Feb. 26, 2019.

* cited by examiner

*Primary Examiner* — Mustak Choudhury
(74) *Attorney, Agent, or Firm* — Fish & Richardson P.C.

(57) ABSTRACT

The disclosure relates to a sample carrier for accommodating a microscopic sample for examination or processing in a microscope system. The sample carrier is accommodatable in an accommodating device, such that the sample carrier in the accommodated state assumes a defined orientation relative to the accommodating device. The sample carrier has an individual sample carrier identifier and is designed to communicate with the microscope system and in the process to communicate the individual sample carrier identifier to the microscope system, such that a sample accommodated on the sample carrier is trackable.

22 Claims, 7 Drawing Sheets

DEVICE AND METHOD FOR TRACKING MICROSCOPIC SAMPLES

CROSS-REFERENCE TO RELATED APPLICATION

This application claims benefit under 35 U.S.C. § 119 to German Application No. 10 2018 206 898.4, filed May 4, 2018. The content of this application is hereby incorporated by reference in its entirety.

FIELD

The disclosure relates to a sample carrier for accommodating microscopic samples, and to an associated accommodating device. The sample carrier and accommodating device can cooperate, such that it is possible to track individual samples. The accommodating device can be part of a sample holder or part of a microscope system that is intended to be used to examine or process the sample. Such a microscope system can be for example an electron microscope, an ion microscope, a light microscope or an X-ray microscope. Moreover, the disclosure relates to a method for tracking microscopic samples.

BACKGROUND

During sample examination with the aid of microscope systems, for example a scanning electron microscope (SEM), it is often desirable to change the samples to be examined. That is to say that samples are introduced into the microscope system and removed again from the microscope system.

In order to realize the sample change, the samples are usually held with the aid of a bipartite system including a sample carrier and a sample holder. The sample is accommodated directly on the sample carrier. For this purpose, the sample is adhesively bonded onto the sample carrier, for example. The sample carrier with the sample secured thereon is then mounted on the sample holder. The sample holder can often accommodate a plurality of sample carriers, which further simplifies and accelerates the sample change. The sample holder is usually held on the microscope stage via a quick-acting closure, such that it can be mounted and demounted simply and rapidly. Sample holders of various designs are available for different types of microscope and types of sample.

Figure 1:
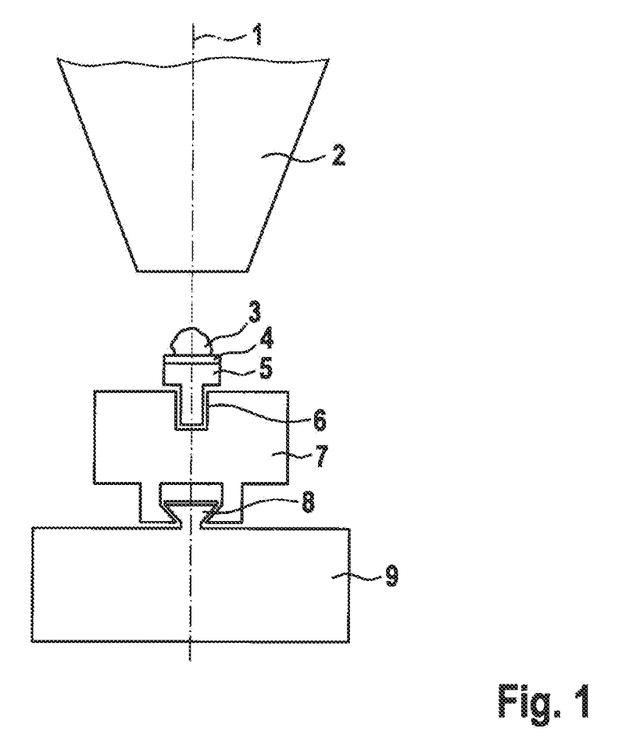
FIG. 1 shows a conventional sample carrier-sample holder system in an SEM (prior art).

FIG. 1 shows, as a sectional view, how in a known manner a sample 3 for examination in a particle beam microscope—an SEM in this example—is held beneath the objective 2 of the microscope. The sample 3 is secured on a sample carrier (stub) 5 via a conductive adhesive layer 4. Known sample carriers 5 are usually of rotationally symmetrical design and include a cylindrical connection piece. The connection piece is held in a circular opening 6 in the sample holder 7 via a screw connection. In this case, the sample carrier 5 can generally be rotated arbitrarily about its longitudinal axis upon insertion into the opening 6, such that the exact orientation of the applied sample 3 relative to the sample holder 7 is randomly chosen and is not reproducible.

The sample holder 7 loaded with one sample carrier 5 or a plurality of sample carriers is mounted on the microscope stage 9 via a dovetail joint 8. The microscope stage 9 is usually movable, such that the microscope stage 9 with the sample holder 7 mounted thereon can be moved. In this way, the sample 3 can be moved and positioned exactly beneath the objective 2. The sample 3 is usually positioned such that it intersects the optical axis 1 of the objective 2 and is situated in the focal region of the objective 2. The sample 3 can then be analysed via the microscope system.

After the conclusion of the examination, the analysed samples are usually removed from the microscope system and taken from the sample holder in order to store them together with the sample carrier in a storage system. If a sample is intended to be examined again later in a microscope system, the following issues can arise. The orientation of the sample relative to the sample holder has not been maintained and is thus unknown. There is just as little knowledge regarding in what sample holder and in what accommodating position on the sample holder the sample was previously examined. This makes it difficult to find again a sample site examined previously. Moreover, the microscope system cannot automatically recognize the sample again, and so the user has to intervene in order manually to transfer information concerning the identity of the sample to the microscope system. Consequently, data concerning one and the same sample, which data were obtained, however, during different work sessions or using different microscope systems, can be collated or correlated only with difficulty and only with laborious manual interventions.

These issues can furthermore entail the permanent risk of samples being mixed up. Moreover, it can be difficult to find again an already examined sample site (region of interest, ROI), particularly if a sample holder of different design is intended to be used during the renewed examination. At any rate the user has to make the data of the sample available manually not only in the first examination, but also in all following examinations.

For electron microscopy there are sample holders of many different designs. Some have complex geometries and are therefore correspondingly expensive. Usually, the dimensions and geometries of the conventional sample holders are sufficiently known, such that sample carriers having fixed samples which are held on a sample holder in a microscope system can be navigated reliably.

For scanning electron microscopy, rotationally symmetrical sample carriers in the form of a so-called "stub" are known, to which a sample is applied. The stubs are typical consumable materials for single use.

In transmission electron microscopy, TEM grids are customary, which are held in a goniometer for examination purposes.

In order to make it easier for the user to localize a sample in the sample holder, various methods and aids have been proposed. One known possibility is to apply markings (usually numbers) to the sample holder. Here, however, the user has to note manually for each sample the position in which the sample is held in the sample holder. If the sample is intended to be examined once again later, the sample can be positioned in the same position again, but the rotational orientation of the stub is not maintained.

In order to identify the sample holder design, it is known to apply markings to the sample holder. These may be for example bar codes, 2D matrix codes or else engraved material numbers. This method is suitable only to a limited extent, however, for the individual identification of sample carriers, since a code applied on the sample carrier would have to be very small, which would make read-out more difficult and would be associated with high production costs.

SUMMARY

The present disclosure seeks to provide a sample carrier system with which microscopic samples can be unambiguously recognized and re-recognized by the microscope system respectively used, such that the samples can be digitally identified and tracked. In addition, the present disclosure seeks to provide a method by which microscopic samples can be digitally identified and tracked.

In one aspect, the disclosure provides a sample carrier for accommodating a sample for examination or processing in a microscope system. The sample carrier is accommodatable in an accommodating device. The sample carrier has an individual sample carrier identifier and is designed to communicate with the microscope system and in the process to communicate the individual sample carrier identifier to the microscope system, such that a sample accommodated on the sample carrier is trackable.

In another aspect, the disclosure provides a sample holder for accommodating a sample carrier for microscopic samples. The sample holder includes an accommodating device, in which a sample carrier is accommodatable and which is designed to hold the sample carrier in a defined orientation relative to the sample holder. The accommodating device has an individual position identifier. The sample carrier has an individual sample carrier identifier. The sample holder is furthermore designed to communicate with the microscope system and an accommodated sample carrier and in the process to communicate the individual position identifier and the individual sample carrier identifier of the sample carrier, such that a sample accommodated on the sample carrier is trackable.

In another aspect, the disclosure provides a method for tracking a microscopic sample. The method includes: a) providing the sample accommodated on a sample carrier, wherein the sample carrier has an individual sample carrier identifier and is designed to communicate with a microscope system; b) accommodating the sample carrier in a first accommodating device of a first sample holder, wherein the accommodated sample carrier assumes a defined orientation relative to the first sample holder, and the first accommodating device has a first individual position identifier and is designed to communicate with the microscope system; c) reading out the sample carrier identifier in conjunction with the first position identifier; and d) communicating the identifiers read out to a control unit of the microscope system.

In another aspect, the disclosure provides a computer program that includes a sequence of control commands that causes a microscope system to carry out a method according to the preceding paragraph.

A sample carrier (stub), sometimes also called object carrier, is understood to mean a device that accommodates a sample to be examined. That is to say, therefore, that the sample is more or less directly connected to the sample carrier. The sample can be secured to the sample carrier for example via an adhesive bond, a clamping mechanism or by adhesion. The sample usually remains permanently secured on the sample carrier, such that a sample carrier is generally used only once. Sample carriers are thus typical consumable materials that should be available in large quantities.

A sample holder is understood to mean a device which can accommodate one or a plurality of sample carriers at specific accommodating positions and can generally be secured reversibly to a microscope system, usually to the movable microscope stage of the microscope system. Sample holders often have a complex geometry, the configuration of which can vary depending on microscopy method, microscope system used and type of sample.

The disclosure is based, in part at least, on the insight that sample carriers for microscopic samples can be provided in the form of small printed circuit boards or chips which can be accommodated in an accommodating device, for example an insert on the sample holder. As a result, it is possible to read the sample carrier electrically or optically, wherein the sample carrier together with the sample fixed thereon is arranged in a defined orientation relative to the sample holder. Each insert additionally has an individual position identifier, for example an insert number, such that the position identifier of the insert can be linked with the sample carrier identifier. In this way, it is possible to rerecognize an individual sample on the basis of the sample carrier identifier and to track in what insert, i.e. in what recording position on a sample holder, the sample is or was situated.

A position (accommodating position) is understood to mean the location at which a sample carrier is localized in the accommodated state. Each accommodating device has a position identifier that individually identifies the accommodating device. The accommodating position of a sample carrier can be defined for example by the indication of the sample holder used and the indication of the insert used on the sample holder. The indication of the accommodating position (i.e. the position identifier) thus yields the information of where the sample carrier is situated.

Orientation is understood to mean the spatial orientation of an accommodated sample carrier relative to the accommodating device. In the simplest case there is exactly one spatial orientation of the sample carrier, which allows the sample carrier to be held in the accommodating device. This orientation is known and reproducible.

It can be particularly advantageous if the accommodating device additionally has a defined spatial orientation relative to at least one of the optical axes of the microscope system. As a result, a sample carrier held by the accommodating device also has a defined, i.e. known, orientation relative to the optical axis or optical axes.

The disclosure can provide the advantage that, firstly, sample carriers can be produced expediently and in large numbers and that, secondly, a sample accommodated on such a sample carrier can be reliably tracked.

In this case, errors during sample assignment are minimized and mix-ups are virtually precluded. Since the sample carrier system according to the disclosure additionally reduces the degrees of freedom in the orientation of the sample to a minimum, this makes it possible and makes it easier for a specific sample site (ROI) on a sample to be found again unambiguously and without errors.

Moreover, the embodiment of the sample carriers using semiconductor or printed circuit board technology can make it possible to provide further storage devices on the sample carrier. As a result, metadata, such as e.g. user data, images or spectra generated by the microscope system and specific examination or operating conditions, can be stored on the sample carrier. This additionally has the advantage that these data can be archived together with the sample, which, after all, remains permanently on the sample carrier.

An accommodating device according to the disclosure can be arranged on a sample holder. The sample holder can be the further development of a known sample holder whose exact dimensions and accommodating positions and also geometries are known. Likewise known are coordinate systems and calculation methods that can be used to exhaustively describe the geometries of a sample holder as such and also in relation to the microscope system respectively used. In addition, methods are known by which the coordinate systems of different sample holders can be related to one another, such that the logical relationship between a first accommodating position on a first sample holder and a further accommodating position on a second sample holder can be determined. A control unit of a microscope system can thus be enabled to find a sample again, to identify it and to position it exactly if the sample is held firstly in the first accommodating position and, in a further examination, then in the second accommodating position of a sample carrier system according to the disclosure.

Furthermore, the disclosure also relates to a method for recognizing and rerecognizing a sample with the aid of the sample carrier system according to the disclosure. By reading out the individual sample carrier identifier and the individual accommodating position in which the sample carrier is currently situated, the control unit of a superordinate system can ascertain at any time where a specific sample carrier is situated. By linking the identifier of a specific sample carrier with information about the sample accommodated on the sample carrier, it is thus also possible for an individual sample to be tracked.

Exemplary embodiments of the disclosure are explained below with reference to figures. For the purpose of explaining the components, therefore, reference is also made to the respectively preceding and succeeding description in its entirety.

DESCRIPTION OF EXEMPLARY EMBODIMENTS

Figure 2:
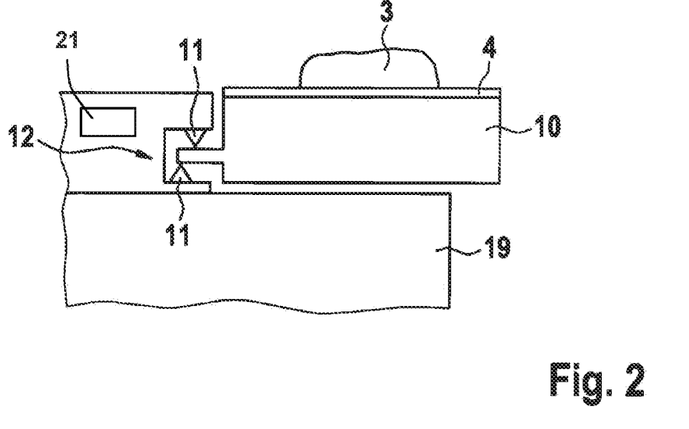
FIG. 2 shows one example of a sample carrier according to the disclosure.

FIG. 2 shows a sample carrier 10 according to the disclosure. An adhesive layer 4 is applied to the surface of the sample carrier 10, via which adhesive layer a sample 3 can be secured to the sample carrier 10. Alternatively, it is conceivable for the sample 3 to be fixed to the sample carrier 10 via a clamping device (not shown) or some other securing device.

Advantageously, the sample carrier 10 is fabricated using printed circuit board technology or semiconductor technology. That is to say that the sample carrier 10 is configured as a printed circuit board or as a silicon chip. Moreover, the sample carrier 10 includes an electrically readable, individual identifier. The sample carrier 10 is thus designed to transmit electrical signals and to communicate at least the individual sample carrier identifier to other components, for example a sample holder or a control unit of a microscope system.

For this purpose, the sample carrier 10 cooperates with an accommodating device 12, in which the sample carrier 10 can be reversibly accommodated. In the embodiment shown in FIG. 2, the sample carrier 10 is fixed in the accommodating device 12 via friction by way of springs 11. The accommodating device 12 can be part of a sample holder 19. The sample carrier 10 is configured such that it assumes a defined orientation relative to the accommodating device 12. That means that a sample 3 fixed on the sample carrier 10 is also oriented in a defined manner relative to the accommodating device 12 and thus also relative to the sample holder 19. The sample holder 19 can be mounted on a microscope system in a defined manner, such that the sample holder 19 assumes a defined orientation relative to an optical axis of the microscope system. Consequently, the sample 3 fixed on the sample carrier 10 is also arranged in a defined orientation relative to the optical axis.

An electrical contact can be produced via the accommodating device 12, via which electrical contact the sample carrier 10 can communicate electrical signals. In this regard, the sample carrier 10 can communicate its individual identifier (sample carrier ID) to the sample holder 19. It is also conceivable for the sample holder 19 to interrogate the individual identifier of the sample carrier 10. The electrically readable sample carrier ID is a unique specimen identifier and can be a serial number, for example. In FIG. 2, the accommodating device 12 includes an individual position identifier 21.

For providing the identification data, one or a plurality of electronic components can be integrated on or in the printed circuit board or the silicon chip.

The sample carrier 10 can be produced with the aid of customary fabrication methods of semiconductor or printed circuit board technology. That is to say that the sample carriers 10 can be configured for example as an FR4 printed circuit board, a ceramic printed circuit board, as a microchip or in some other conventional form, such that the sample carriers 10 are equipped with electrical and mechanical functions and can be fabricated cost-effectively in large quantities.

In one particular embodiment, which can preferably be used in the case of light microscopes, the accommodating device 12 is part of a microscope system. That is to say that the accommodating device is not arranged on a sample holder, but rather directly on the microscope system. In this embodiment, the sample carrier 10 communicates directly with the microscope system.

Figure 3A:
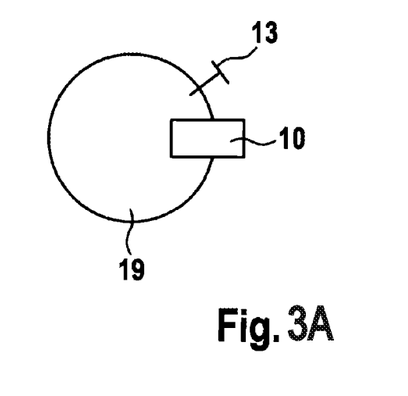
FIGS. 3A to 3D show further embodiments of the sample carrier according to the disclosure, which differ in how the sample carrier cooperates mechanically with a respectively associated accommodating device.
Figure 3B:
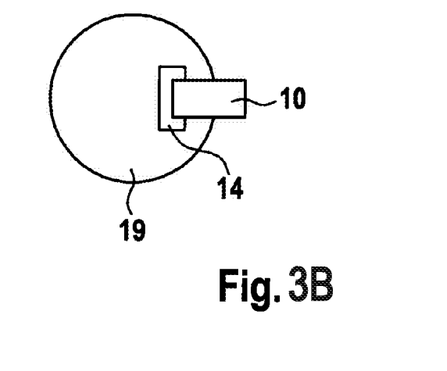
Figure 3C:
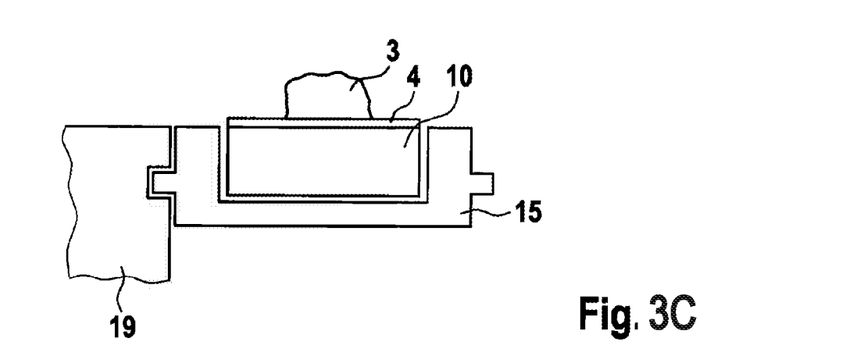
Figure 3D:
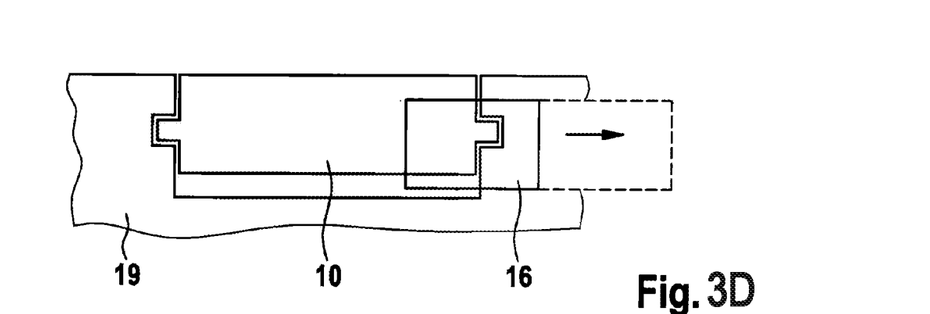

FIGS. 3A to 3D show further embodiments of the sample carrier according to the disclosure, which differ in how the sample carrier cooperates mechanically with the accommodating device. Besides the friction fixing shown in FIG. 2, the sample carrier can also be fixed in the accommodating device in some other way, as illustrated in FIGS. 3A to 3D. In this regard, it is conceivable to position the sample carrier 10 via a latching mechanism (FIG. 3A). In this case, a locking arrangement latches in place on account of a spring force at the sample carrier 10. For unlocking purposes, provision can be made of a respective button 13 per sample carrier 10 or a central button (not shown) for a plurality of sample carriers. Alternatively, a guide frame 15 can be provided, into which the sample carrier 10 is inserted (FIG. 3C). It is furthermore possible for the accommodating device to include a locking mechanism used to fix the sample carrier (FIG. 3D). Here a locking slide 16 is pushed by spring force in front of the sample carrier 10. If the locking slide 16 is pushed to the side, the sample carrier 10 can be removed. It is also conceivable for provision to be made of a spring that pushes out the sample carrier 10 in order to facilitate removal. Moreover, the sample carrier 10 can be held in position via a push-push mechanism (FIG. 3B). The sample carrier latches into a contact strip 14 upon being pushed in. By being pushed again, it jumps back out and can be removed. What the embodiments mentioned above have in common is that the sample carriers 10 can be changed without tools. It is also conceivable, however, for a sample carrier 10 according to the disclosure to be held in an accommodating device via a screw connection.

Figure 4A:
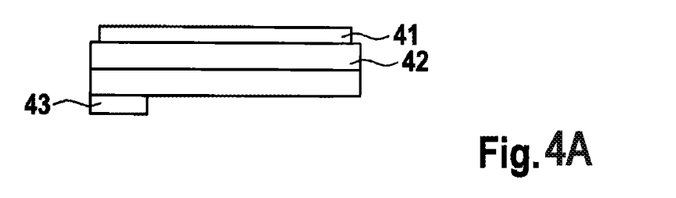
FIGS. 4A and 4B show different types of sample carriers according to the disclosure.
Figure 4B:
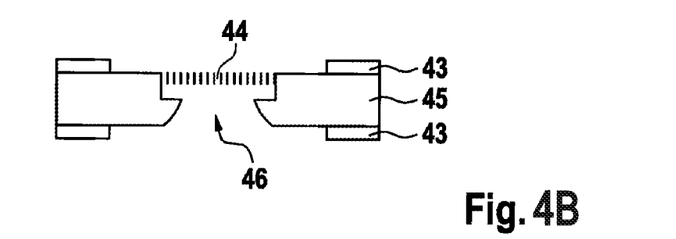
Figure 5A:
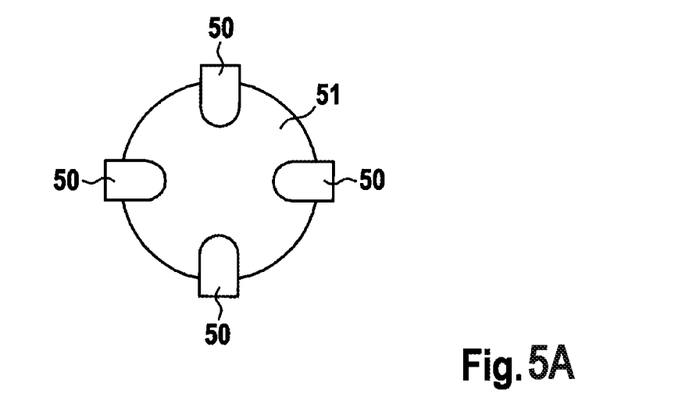
FIGS. 5A and 5B show a sample holder according to the disclosure.
Figure 5B:
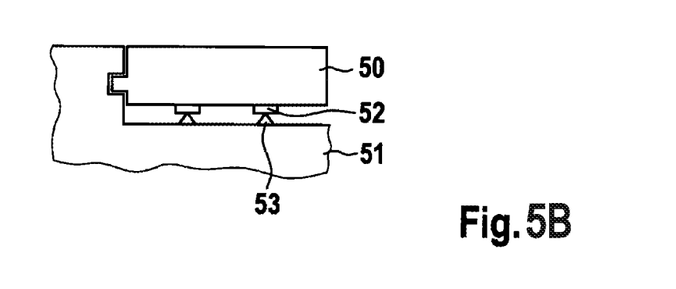

FIGS. 4A and 4B show different types of the sample carrier 42, 45, which are intended for different microscopy methods. In principle, a sample carrier 42, 45 according to the disclosure can be configured for transmitted-radiation microscopy or for reflected-light microscopy. In this context, the term "reflected-light" encompasses not only methods appertaining to light microscopy but also methods which employ electron beams and/or ion beams and in each case do not transmit radiation through the sample.

FIG. 4A illustrates a reflected-light sample carrier 42, which can be used in an SEM, for example. The sample carrier 42 can have an adhesive layer 41, and also contacts 43, via which the sample carrier 42 can be connected to an accommodating device. Alternatively, the sample carrier 42 can be configured such that the sample can be secured by a clamping mechanism or by adhesion.

FIG. 4B shows a transmitted-radiation sample carrier 45 for transmission electron microscopy (TEM) or scanning transmission electron microscopy (STEM). The sample carrier 45 has an opening 44, which constitutes an electron-transparent region. Advantageously, the opening 44 is covered with a TEM grid 44 or a membrane, onto which the sample can be positioned. In addition, the sample carrier 45 can have contacts 43, via which an electrical contact with the accommodating device can be produced.

A sample carrier of a similar design to sample carrier 45 can be used for light microscopy. In this case, too, the sample carrier includes a transparent opening, specifically a light-transmissive opening. For this purpose, the region of the opening is advantageously fabricated from a suitable light-transmissive material. A sample can be applied to the light-transparent region and fixed.

As already explained in the description concerning FIG. 2, the sample carriers 42, 45 shown in FIGS. 4A and 4B also include a device for providing an individual identifier. In addition, the sample carriers 42, 45 are designed to cooperate mechanically with an accommodating device and to transmit data.

Generally, a sample carrier according to the disclosure can include a further electronic storage device in addition to the sample carrier ID. This can be realized by virtue of one or a plurality of electronic components providing memory space for storing data about the sample or for the identification of the sample. That is to say, therefore, that the sample carrier includes memory space, such that it is electronically writable and readable. Consequently, data can be stored on the sample carrier be kept available and archived together with the sample fixed thereon.

The sample carrier can be read via a sample holder or communicate directly with a microscope system. The data transmission between sample carrier and microscope system or sample carrier and sample holder is conceivable in many different ways, thus for example via electrical contacts, via inductive or capacitive coupling, as optical transmission such as e.g. via LED or laser, by radio link or by a combination of a number of the possibilities mentioned.

It is also conceivable for the sample holder to communicate to the sample carrier only the accommodating position thereof (e.g. in the form of a position identifier), e.g. via fixed coding read out by electrical contacting, a bus system or the like, and to provide a voltage supply. The sample carrier can then communicate directly with the microscope system and communicate the sample carrier identifier together with the position identifier, for example by NFC (Near Field Communication). In this case, it is particularly advantageous if the sample carriers are equipped with cost-effective RFID transponders (Radio-Frequency Identification), such that data can be transmitted contactlessly.

Moreover, it is possible for the sample carrier to signal its position and orientation optically (e.g. by LED) and for this signal to be evaluated via a camera incorporated in the microscope system.

The sample carrier can furthermore have a device to which an additional identifier can be applied. In this case, it is advantageous if the user can read the additional identifier directly or with the aid of a reader. This facilitates the handling of the sample carriers loaded with samples, since, on the basis of the additional identifier, the user can identify what sample is involved.

The additional identifier can be identical to the individual sample carrier identifier, e.g. a distinctive serial number. However, both identifiers can also be different. It is particularly advantageous here if the additional identifier is easy for the user to understand and includes natural language or plaintext, for example. The additional identifier can be linked with the individual sample carrier identifier.

Particularly for the use of the sample holder in particle beam devices employing a beam of charged particles, it is advantageous if the surface of the sample carrier is partly or completely electrically conductively coated. It is also conceivable for the sample carrier to be provided wholly or partly with different coatings.

A sample holder according to the disclosure includes one or a plurality of accommodating devices, in each of which a sample carrier according to the disclosure can be accommodated and via which the cooperation with the sample carrier is made possible. The accommodating device can be configured as a slot, for example, that is to say as an insert into which a sample carrier can be inserted. Each individual accommodating device includes an individual position identifier that uniquely identifies the accommodating position on the sample holder. This may be the number of the slot, for example. The accommodating device is configured such that a sample carrier accommodated therein has a defined orientation relative to the sample holder.

The sample holder can be fixedly connected to a microscope system. Alternatively, the sample holder can be mounted reversibly on the microscope system. At any rate the sample holder assumes a defined and thus reproducible, i.e. always identical, orientation relative to the microscope system. This can be realized e.g. via a quick-acting closure with sliding contacts. The quick-acting closure can be embodied for example in the form of a dovetail guide or as a clamping, click or bayonet closure. As a result of the defined orientation relative to the optical axis of the microscope system, also each individual accommodated sample carrier and thus also a sample fixed onto a sample carrier are oriented in a defined and thus known orientation with respect to the optical axis of the microscope system.

Moreover, the sample holder includes devices which allow communication with an accommodated sample carrier and the microscope system. That is to say that the sample holder can communicate at least the individual position identifiers of the occupied accommodating devices. It is advantageous, moreover, if the sample holder can interrogate individual sample carrier identifiers of the accommodated sample carriers and communicate them to the microscope system, to put it more precisely to the control unit of the microscope system.

The data transmission between the sample holder and microscope system is conceivable in many different ways, thus for example via electrical contacts, via inductive or capacitive coupling, as optical transmission such as e.g. via LED or laser, by radio link or by a combination of a number of the possibilities mentioned.

In this case, the sample holder can be read in different states. Firstly, it is conceivable for the sample holder to be read in the installed state, i.e. when it is mounted on the microscope stage. Secondly, it is possible to read the sample holder when it is in a transfer state. In this regard, it can be read during lock transfer within a vacuum lock of the microscope system or after lock transfer when the microscope stage moves from the lock position to an operating position. Finally, it is also conceivable for the sample holder to be read outside the microscope system.

Figure 6:
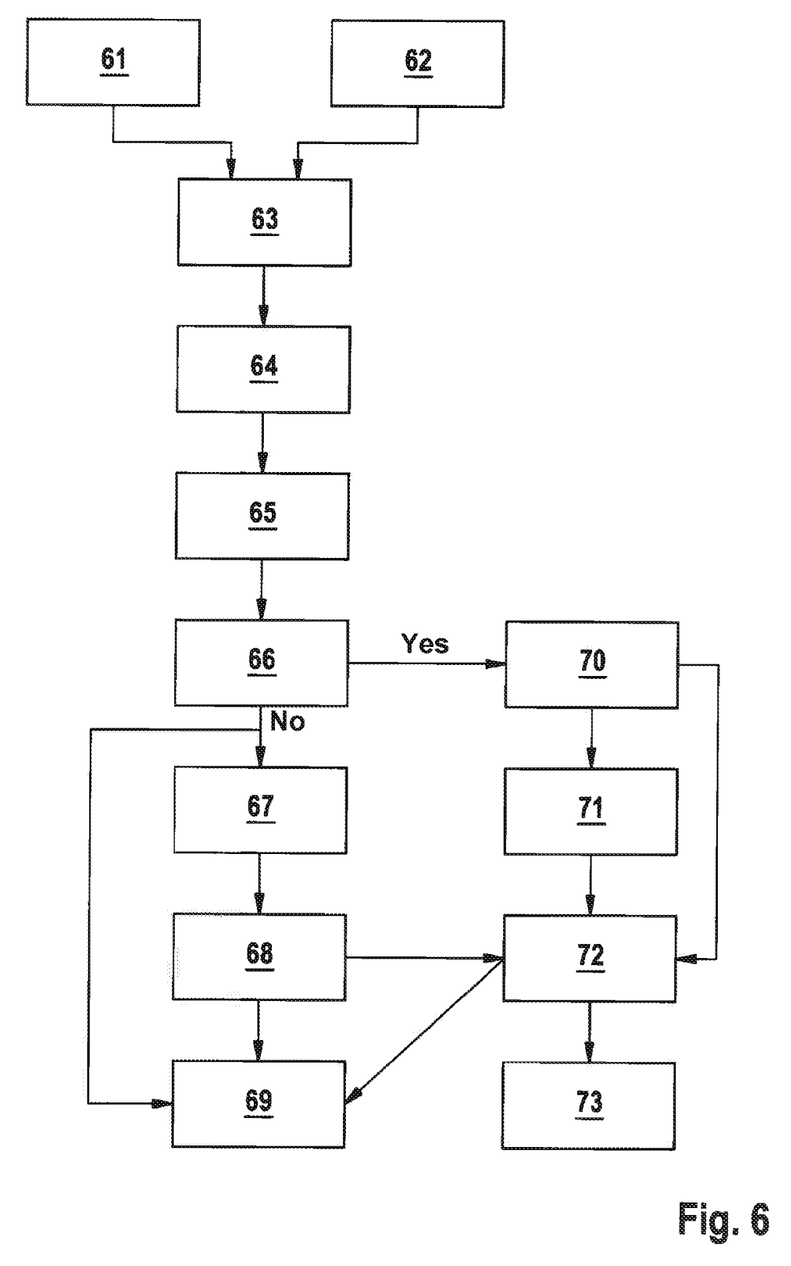
FIG. 6 shows a flow diagram of a method according to the disclosure.

Furthermore, the disclosure includes a method for tracking microscopic samples, which method is illustrated schematically in FIG. 6. A sample carrier system described above is used for this purpose. A first step 61 involves providing a sample carrier according to the disclosure, to which a sample to be examined is secured. It is also conceivable for the sample already to have been applied to the sample carrier during an earlier examination and known to be provided (step 62). At any rate the sample carrier has an individual sample carrier identifier and is designed to communicate with a microscope system.

Step 63 involves accommodating the loaded sample carrier in an accommodating device. It is advantageous if the accommodating device is an insert on a sample holder. In the accommodated state, the sample carrier has a defined orientation relative to the accommodating device and thus also relative to the sample holder. The accommodating device includes an individual position identifier that uniquely characterizes the accommodating position.

Step 64 involves introducing the sample holder together with the sample carrier into a microscope system. Step 65 involves reading out the individual identifier of the sample carrier together with the position identifier of the accommodating device occupied by the sample carrier, and transmitting them to a control unit.

Advantageously, the identifiers read out are communicated to the control unit of the microscope system. The microscope system thus receives the information concerning what sample carrier has been accommodated and where it is situated. In the simplest case that is sufficient to be able to track and to rerecognize a sample which has been permanently accommodated on the sample carrier. Usually, for a sample held in an accommodating position, the coordinates in x-, y- and z-directions and indications concerning rotation and tilting are also stored, however, such that a region of interest on the sample can be found again.

It is also conceivable for method steps 64 and 65 to be carried out in a different order. In this regard, by way of example, the sample carrier ID can be read out before the sample carrier is introduced into the microscope system. This may be the case, for example, if the sample holder is introduced into the microscope system via a lock and the sample carrier is read upon passing a specific lock position.

The data transmission can take place in the same way as already described above for sample carrier and sample holder. In this regard, the data transmission can be realized for example via electrical contacts, via inductive or capacitive coupling, as optical transmission such as e.g. via LED or laser, by radio link or by a combination of a number of the possibilities mentioned.

Step 66 involves carrying out an interrogation of whether the sample carrier identifier read out is already known to the control unit of the microscope system.

If this is the case (result of interrogation: yes), the data already present concerning the sample carrier identifier are loaded in step 70. On the basis of these data, the sample can be navigated or positioned such that a region of interest (ROI) identified earlier can be analysed by the microscope system (step 71). In step 72, the sample is analysed. Finally, in step 73, data present and data newly obtained can be automatically linked or superimposed.

If the interrogation reveals that the sample is still unknown (result of interrogation: no), a further interrogation is started in step 67, via which further interrogation the user can input information about the sample. In step 68, the entered sample description and the individual sample carrier identifier are linked together. In step 72, the sample is analysed in the microscope system.

It is also conceivable for method steps 67 and 68 to be omitted, such that, in the case of a hitherto unknown sample, only the analysis data newly obtained are linked with the sample carrier identifier (step 69).

As already described above, a sample carrier according to the disclosure can have a data storage device. The method can then include an additional step, wherein the data obtained during the analysis of the sample are stored on the data storage device of the sample carrier.

Figure 7:
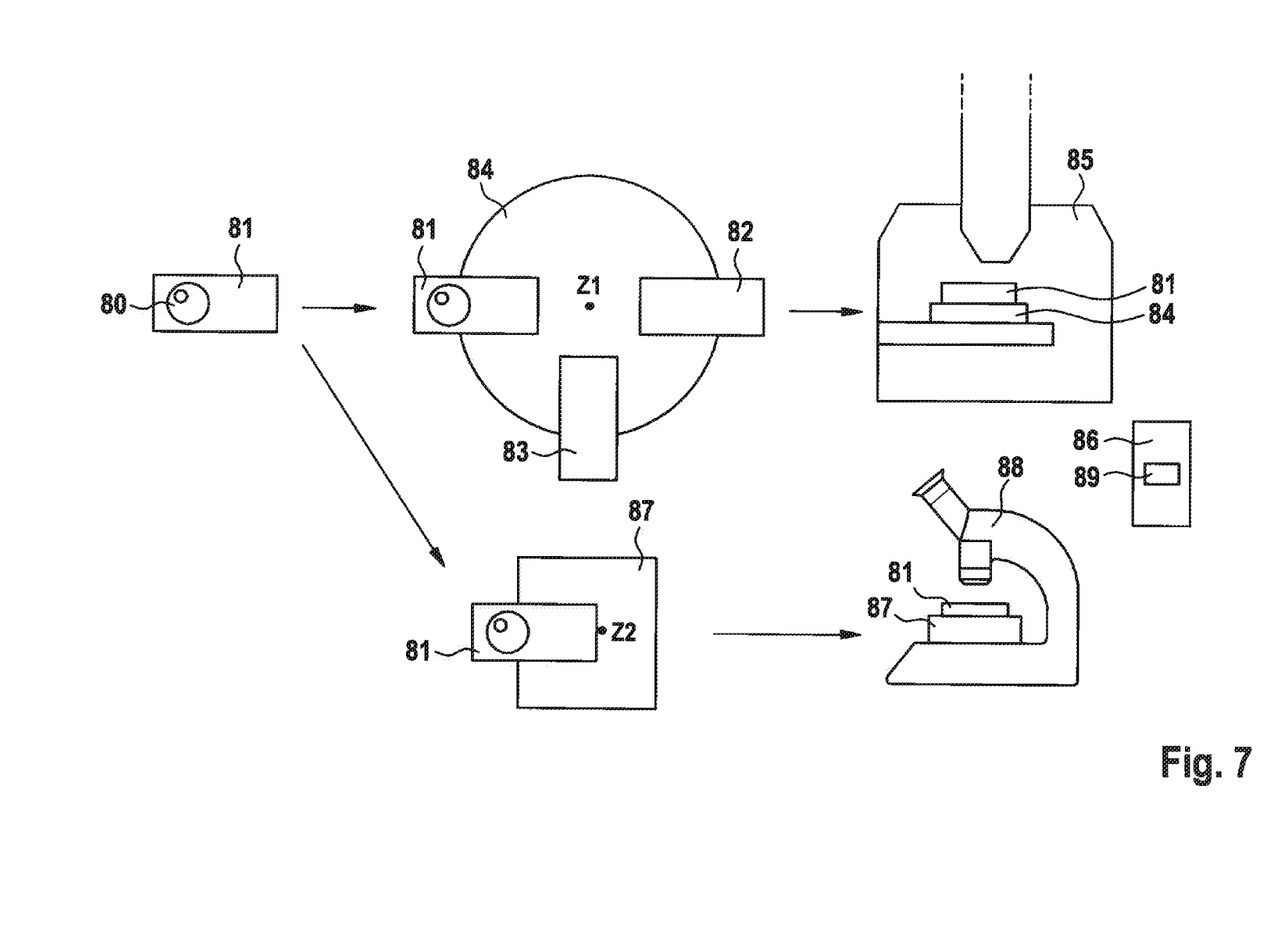
FIG. 7 schematically shows the sequence of a method according to the disclosure in which a sample carrier loaded with a sample is introduced successively into two different microscope systems.

In principle, it is conceivable for the method to be carried out via two different microscope systems, as illustrated in FIG. 7. For this purpose, a sample carrier 81 carrying a sample 80 is examined firstly in a first microscope system, for example a scanning electron microscope 85, and then in a second microscope system, for example a light microscope 88.

Figure 9:
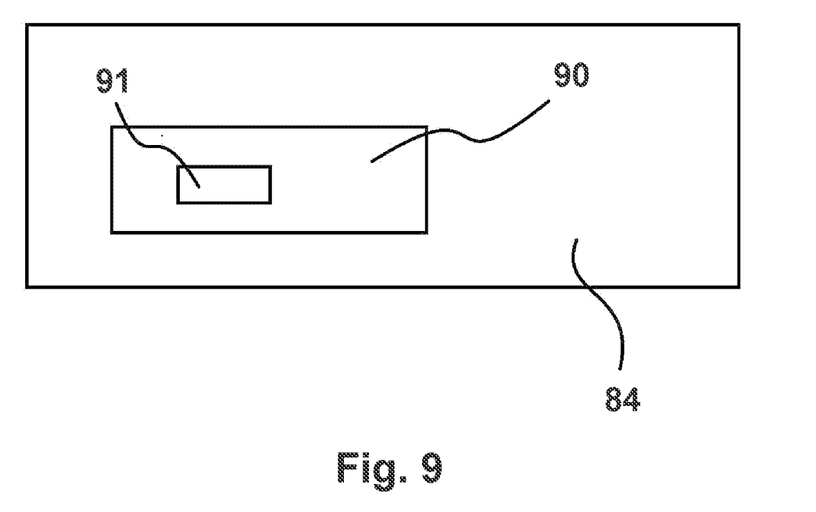
FIG. 9 shows a sample carrier with an accommodating device having an individual position identifier.

Firstly, the sample carrier 81 is accommodated in a first sample holder 84. Here in each case the individual sample carrier identifier and the current position identifier are read out and communicated to a control unit 86. The sample holder 84 is introduced into the scanning electron microscope 85, such that the sample 80 can then be analyzed. FIG. 9 shows that the sample holder 84 includes an accommodating device 90 with an individual position identifier 91.

As illustrated in FIG. 7, it is conceivable for the sample holder 84 to have further accommodating positions, in which further sample carriers 82, 83 can be accommodated. The accommodating positions for accommodating the sample carriers 81, 82, 83 are positioned in each case relative to a central reference point Z1 on the sample holder 84. The position of each accommodated sample carrier relative to the reference point Z1 is thus known. If a sample region of interest (ROI) is then examined, its position relative to the reference point Z1 can be stored. On the basis of the stored position in relation to the reference point Z1, the same sample site can be found again during a later examination.

This is also possible if the sample carrier is accommodated in a different accommodating device of the sample holder, the position of which accommodating device relative to the reference point Z1 is after all likewise known, such that it is possible to determine computationally how the sample stage is to be moved in order to be able to observe or process the region of interest.

Figure 10:
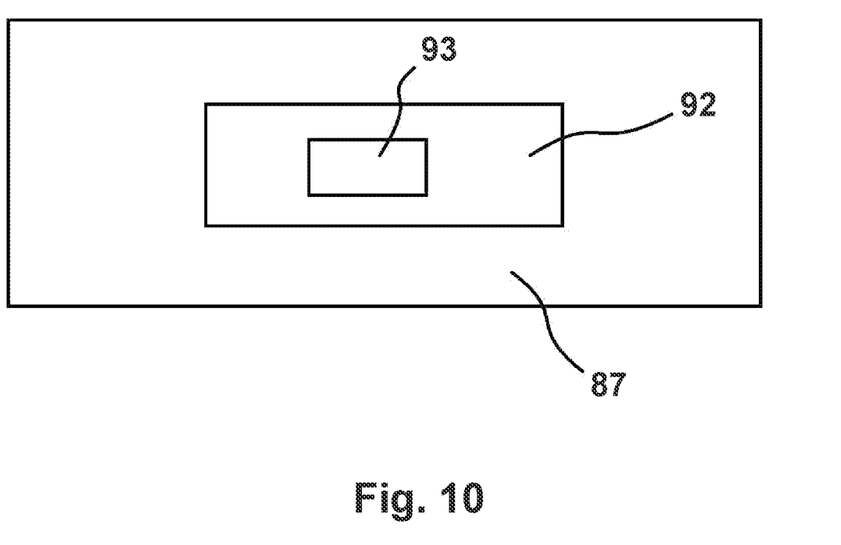
FIG. 10 shows a sample carrier with an accommodating device having an individual position identifier.

After the examination in the first microscope system 85, the sample carrier 81 is introduced into a second sample holder 87. Here, too, in each case the sample carrier identifier and the current position identifier are read out and communicated to a control unit 86. The second sample holder 87 is introduced into the light microscope 88, such that the sample 80 can be analyzed with the aid of a light microscope 88. FIG. 10 shows that the sample holder 87 includes an accommodating device 92 with an individual position identifier 93.

The position of the accommodating device on the sample holder 87 relative to a second central reference point Z2 is advantageously known. The central reference points Z1 and Z2 can be related to one another with the aid of geometric calculations. As a result, a sample region of interest can be found again which is now held on the sample holder 87 and the position of which relative to the reference point Z1 on the sample holder 84 previously used was determined and stored.

It is particularly advantageous if data about dimensions and geometries of the sample holders 84, 87 used are made available in the control unit 86, such that the data and identifiers can be computed in order to determine the identity and the respective current position of the sample 80. This is done by computing geometric data with one another.

The control unit 86 can include or accommodate a computer program product 89 having a sequence of control commands (computer program) that causes the scanning electron microscope 85 and/or the light microscope 88 to carry out the method according to the disclosure for tracking a microscopic sample. Alternatively, it is also conceivable for the computer program to be transmitted into the control unit purely digitally—for example by downloading or streaming.

Figure 8:
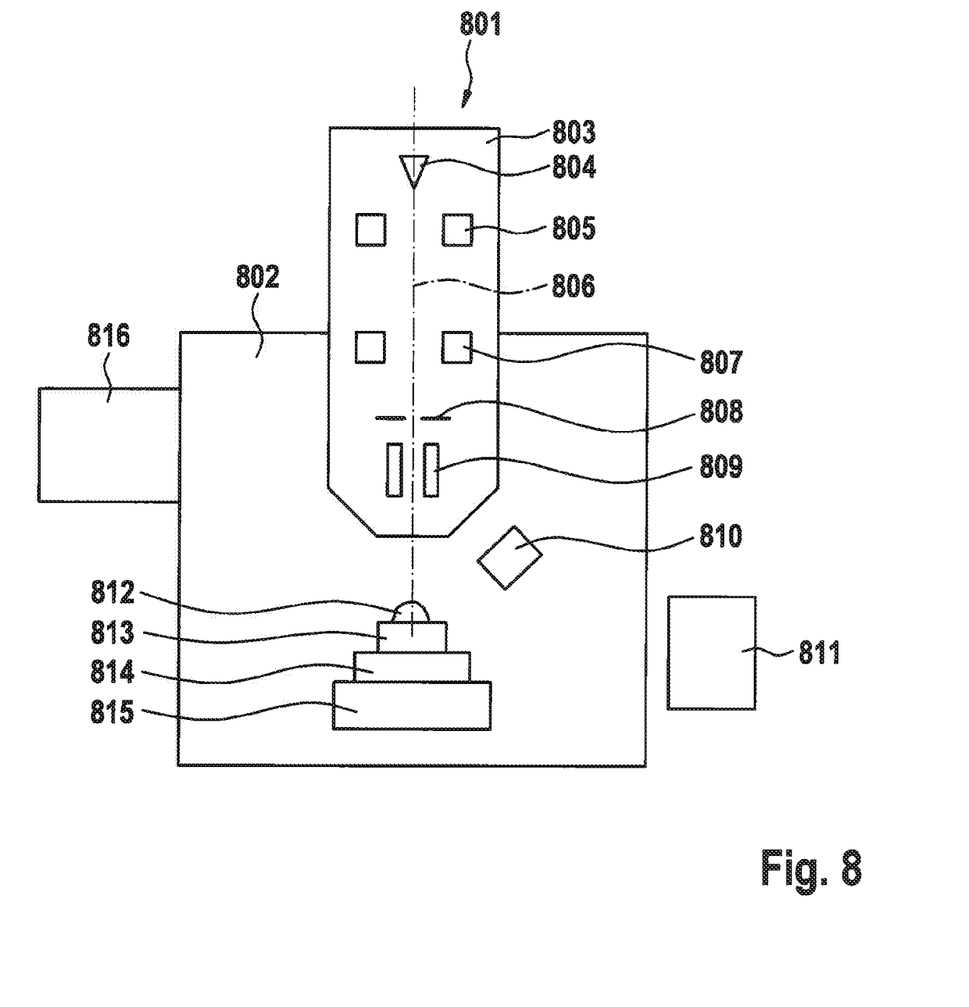
FIG. 8 shows a particle beam device in which a sample carrier system according to the disclosure can be used.

FIG. 8 schematically shows a scanning electron microscope 801 that can be used to carry out the method according to the disclosure. The scanning electron microscope 801 has an electron beam column 803 for generating an electron beam. During operation, the electron beam is directed onto the processing location on the sample 812. The sample 812 is held via a sample carrier 813 and a sample holder 814 on a movable microscope stage 815 and is situated in a sample chamber 802 of the scanning electron microscopes 801. During operation, vacuum conditions usually prevail in the sample chamber 802. It is particularly advantageous if the SEM 801 additionally has a vacuum lock 816, via which samples 812 can be transferred in and out, without the vacuum of the sample chamber 802 having to be breached in the process.

The microscope stage 815 is advantageously configured as a five-axis sample stage. That means that the sample 812 can be moved in the x-, y- and z-directions—that is to say in three mutually perpendicular spatial directions—and can be rotated about a tilt axis and an axis of rotation.

During operation, primary electrons are produced in the electron source 804, the primary electrons being accelerated along the optical axis 806 of the electron beam column 803, focused by the lens systems 805, 807 and trimmed by at least one aperture stop 808. Moreover, the electron beam column 803 includes a deflection system 809, via which the primary electron beam can be guided over the surface of the sample 812 in a raster-type manner. The scanning electron microscope 801 includes at least one detector 810 for detecting interaction products of the interaction of particle beam and sample 812.

Moreover, the scanning electron microscope 801 includes a control unit 811, which can execute microscope software and via which the user can input and interrogate data. The control unit 811 can carry out a sequence of control commands included in a computer program. As a result of carrying out the control commands, the scanning electron microscope 801 is caused to carry out the method according to the disclosure.

It is also conceivable for the microscope system to be configured as a two-beam device, which is also referred to as an FIB-SEM combination device. In contrast to a scanning electron microscope as described above, a two-beam device additionally includes a second particle beam column configured as an ion beam column (focused ion beam, FIB). Both particle beams are directed onto the processing location on the sample, which is usually situated at the coincidence point of both particle beams. The ion beam column includes an ion source, a deflection system and a focusing lens. The ions generated in the ion source are accelerated along the optical axis of the ion beam column and focused, such that the ions impinge on the sample in a focused manner and can be used to remove material from the sample and/or to image the sample.

Furthermore, the microscope system can also be configured as a light microscope or X-ray microscope.

LIST OF REFERENCE SIGNS

1 Optical axis
2 Objective
3 Sample
4 Adhesive layer
5 Sample carrier
6 Opening
7 Sample holder
8 Dovetail joint
9 Microscope stage
10 Sample carrier
11 Spring
12 Accommodating device
13 Release button
14 Contact strip
15 Insert frame, guide frame
16 Locking slide
19 Sample holder
41 Adhesive layer
42 Sample carrier
42 Contact
44 TEM grid
45 Transmitted-light sample carrier
46 Opening
50 Sample carrier
51 Sample holder
52 Contact
53 Spring
61 Secure sample on sample carrier
62 Provide sample carrier with sample from earlier examination
63 Mount sample carrier on sample holder
64 Introduction into microscope system
65 Read-out of sample carrier ID and position identifier
66 Interrogation: Is sample known?
67 Interrogation: Input information about sample
68 Link sample carrier ID and sample description
69 Link sample carrier ID and sample data
70 Load data present about sample
71 Navigation/selection of ROI on the basis of these data 72 Analyse sample
73 Automatically link or superimpose different data sets
80 Sample
81 First sample carrier
82 Second sample carrier
83 Third sample carrier
84 First sample holder
85 Scanning electron microscope
86 Control unit
87 Second sample holder
88 Light microscope
89 Computer program product
Z1 First central reference point
Z2 Second central reference point
801 Scanning electron microscope
802 Sample chamber
803 Electron beam column
804 Electron source
805 Lens system
806 Optical axis
807 Lens system
808 Aperture stop
809 Deflection system
810 Detector
811 Control unit
812 Sample
813 Sample carrier
814 Sample holder
815 Microscope stage
816 Vacuum lock

What is claimed is:

1. A sample carrier, wherein: the sample carrier comprises a member selected from the group consisting of a silicon chip and a printed circuit board; the sample carrier is configured to accommodate a sample to be examined and/or processed in a microscope system; the sample carrier is accommodatable in an accommodating device; the sample carrier comprises an individual sample carrier identifier configured to communicate the individual sample carrier identifier to the microscope system so that a sample accommodated on the sample carrier is trackable; and the sample carrier comprises memory so that information is electronically writable to the sample carrier.

2. The sample carrier of claim 1, wherein the sample carrier is configured to assume a defined orientation relative to the accommodating device.

3. The sample carrier of claim 1, wherein the sample carrier comprises a silicon chip.

4. The sample carrier of claim 1, wherein the sample carrier comprises a printed circuit board.

5. The sample carrier of claim 1, wherein the sample carrier is configured to communicate with the microscope system via a technique selected from the group consisting of electrical contacting, capacitive coupling, inductive coupling, RFID transmission, magnetic transmission, and optical transmission.

6. The sample carrier of claim 1, wherein the surface of the sample carrier comprises an electrically conductive coating.

7. The sample carrier of claim 1, wherein the sample carrier comprises a device configured to have an additional identifier applied thereto.

8. The sample carrier of claim 1, wherein the sample carrier is accommodatable in the accommodating device of a sample holder.

9. The sample carrier of claim 1, wherein the sample carrier is reversibly accomodatable in the accommodating device.

10. A sample holder, comprising:
an accommodating device in which a sample carrier for samples for a microscope system is accommodatable and which is designed to hold the sample carrier in a defined orientation relative to the sample holder,
wherein:
the sample carrier comprises a member selected from the group consisting of a silicon chip and a printed circuit board;
the accommodating device comprises an individual position identifier;
the sample carrier comprises an individual sample carrier identifier; and
the sample holder is configured to communicate with the microscope system and an accommodated sample carrier to communicate the individual position identifier and the individual sample carrier identifier of the sample carrier so that a sample accommodated on the sample carrier is trackable.

11. The sample holder of claim 10, wherein the sample holder is mountable on the microscope system so that the sample holder assumes a defined orientation relative to an optical axis of the microscope system.

12. The sample holder of claim 11, wherein the sample holder is configured to communicate with the microscope system via a technique selected from the group consisting of electrical contacting, capacitive coupling, inductive coupling, RFID transmission, magnetic transmission, and optical transmission.

13. The sample holder of claim 10, wherein the sample holder is configured to communicate with the microscope system via a technique selected from the group consisting of electrical contacting, capacitive coupling, inductive coupling, RFID transmission, magnetic transmission, and optical transmission.

14. A microscope system, comprising the sample holder of claim 10.

15. The sample holder of claim 10, wherein the sample carrier is reversibly accomodatable in the accommodating device.

16. A method, comprising:
providing a sample accommodated on a sample carrier, the sample carrier comprising a member selected from the group consisting of a silicon chip and a printed circuit board, the sample carrier comprising an individual sample carrier identifier and designed to communicate with a microscope system;
accommodating the sample carrier in a first accommodating device of a first sample holder, the accommodated sample carrier assuming a defined orientation relative to the first sample holder, the first accommodating device comprising a first individual position identifier and designed to communicate with the microscope system;
reading out the sample carrier identifier in conjunction with the first position identifier;
communicating the identifiers read out to a control unit of the microscope system.

17. The method of claim 16, further comprising linking the identifiers read out with individual identity data of the sample.

18. The method of claim 16, further comprising:
introducing the sample holder into a microscope system; and analyzing the sample via the microscope system to obtain data about the sample.

19. The method of claim 16, wherein the sample carrier comprises a data storage device, and the method further comprises storing data on the data storage device.

20. The method of claim 16, further comprising:
accommodating the sample carrier loaded with the sample in a second accommodating device of a second sample holder, the second sample holder comprising a second individual position identifier, the accommodated sample carrier assumes a defined orientation relative to the second sample holder, the sample carrier is configured to communicate with the microscope system;
reading out the individual sample carrier identifier in conjunction with the second individual position identifier;
communicating the identifiers read out to a control unit of the microscope system;
providing geometric data about dimensions and geometries of the first sample holder and the second sample holder; and
determining the geometric data and the identifiers so that identity and current position of the sample are determined.

21. One or more machine-readable hardware storage devices comprising instructions that are executable by one or more processing devices to perform operations comprising the method of claim 16.

22. The method of claim 16, further comprising removing the sample carrier from the first accommodating device.

* * * * *

UNITED STATES PATENT AND TRADEMARK OFFICE
CERTIFICATE OF CORRECTION

PATENT NO. : 11,328,896 B2
APPLICATION NO. : 16/398817
DATED : May 10, 2022
INVENTOR(S) : Wolfgang Berger and Simon Diemer Page 1 of 1

It is certified that error appears in the above-identified patent and that said Letters Patent is hereby corrected as shown below:

In the Specification

Column 12, Line 48, delete "42" insert -- 43 --.

In the Claims

Column 14, Line 2, delete "accomodatable" insert -- accommodatable --.

Column 14, Line 42, delete "accomodatable" insert -- accommodatable --.

Signed and Sealed this
Ninth Day of August, 2022

Katherine Kelly Vidal
*Director of the United States Patent and Trademark Office*